(12) United States Patent
Simon et al.

(10) Patent No.: US 10,379,145 B2
(45) Date of Patent: Aug. 13, 2019

(54) MEASURING DEVICE HAVING A SWITCHABLE MEASURING AND OPERATING ELECTRONICS FOR DELIVERING A MEASUREMENT SIGNAL

(71) Applicant: Endress + Hauser Flowtec AG, Reinach (CH)

(72) Inventors: Antoine Simon, St. Louis (FR); Martin Jenzer, Arlesheim (CH)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 262 days.

(21) Appl. No.: 14/906,184

(22) PCT Filed: Jul. 7, 2014

(86) PCT No.: PCT/EP2014/064455
§ 371 (c)(1),
(2) Date: Jan. 19, 2016

(87) PCT Pub. No.: WO2015/010883
PCT Pub. Date: Jan. 29, 2015

(65) Prior Publication Data
US 2016/0161533 A1 Jun. 9, 2016

(30) Foreign Application Priority Data
Jul. 24, 2013 (DE) .................. 10 2013 107 904

(51) Int. Cl.
*G01R 19/165* (2006.01)
*G05B 19/042* (2006.01)

(52) U.S. Cl.
CPC ... *G01R 19/1659* (2013.01); *G01R 19/16528* (2013.01); *G05B 19/0423* (2013.01); *G05B 2219/25428* (2013.01)

(58) Field of Classification Search
CPC .......... G01R 19/1659; G01R 19/16528; G05B 19/423; G05B 2219/25428
See application file for complete search history.

(56) References Cited

U.S. PATENT DOCUMENTS 4,866,435 A * 9/1989 Frick ...................... G08C 19/02
340/870.16
6,480,131 B1 * 11/2002 Roper ................ G05B 19/0423
341/118

(Continued)

FOREIGN PATENT DOCUMENTS

| CN | 2072211U U | 2/1991 |
| CN | 1130945 A | 9/1996 |

(Continued)

OTHER PUBLICATIONS

English Translation of International Preliminary Report on Patentability, WIPO, Geneva, dated Feb. 4, 2016.

(Continued)

*Primary Examiner* — Tung X Nguyen
*Assistant Examiner* — Dominic Hawkins
(74) *Attorney, Agent, or Firm* — Bacon & Thomas, PLLC

(57) ABSTRACT

A measuring device having a configurable measuring and operating electronics for delivering a measurement signal, includes a measurement transmitter with an electrical current control circuit for outputting a controlled electrical current, wherein in a first manner of operation an electrical current is set in a first range, and in a second manner of operation an electrical current is set in a second range having a greater interval than the first range; the measuring device further having a microcontroller circuit is connected with the electrical current control circuit for delivering a digital signal for operating the electrical current control circuit, wherein the digital signal has a LOW state and a HIGH state and wherein by operating the electrical current control (Continued)

circuit an output current can be set with an electrical current level in a first interval for the LOW state and in a second interval for the HIGH state.

16 Claims, 2 Drawing Sheets

(56) References Cited

U.S. PATENT DOCUMENTS

| | | | |
|---|---|---|---|
| 8,576,086 B2 | 11/2013 | Vidal et al. | |
| 8,593,214 B2 | 11/2013 | Bachmann et al. | |
| 2002/0107654 A1* | 8/2002 | Mori | G01R 19/2509 702/120 |
| 2008/0007307 A1* | 1/2008 | Freiburger | G05B 19/0425 327/114 |
| 2008/0288933 A1* | 11/2008 | Budmiger | G01F 1/8431 717/168 |
| 2010/0219961 A1* | 9/2010 | Vidal | F15B 15/2807 340/635 |
| 2010/0308909 A1* | 12/2010 | Verma | H03G 3/3042 330/131 |
| 2011/0015763 A1* | 1/2011 | Mustonen | G05B 19/0423 700/32 |
| 2011/0062942 A1* | 3/2011 | Karbula | G05B 1/03 324/76.11 |
| 2011/0090091 A1* | 4/2011 | Lerche | E21B 41/0021 340/853.2 |

FOREIGN PATENT DOCUMENTS

| | | |
|---|---|---|
| CN | 1300516 A | 6/2001 |
| CN | 1602409 A | 3/2005 |
| CN | 1914568 A | 2/2007 |
| CN | 1942910 A | 4/2007 |
| CN | 102859852 A | 1/2013 |
| DE | 102007054326 A1 | 5/2009 |
| DE | 102010041731 A1 | 4/2012 |
| EP | 2226515 A2 | 9/2010 |
| WO | 8903618 | 4/1989 |
| WO | 95/08123 A1 | 3/1995 |
| WO | 99/59369 A1 | 11/1999 |
| WO | 03/050480 A1 | 6/2003 |
| WO | 2005/101345 A1 | 10/2005 |
| WO | 2009/063033 A2 | 5/2009 |
| WO | 2011009708 A2 | 1/2011 |

OTHER PUBLICATIONS

International Search Report,, EPO, The Netherlands, dated Sep. 26, 2014.
German Search Report, German PTO, Munich, dated Mar. 24, 2014.
"Switch Amplifier KCD2-SR-Ex1.LB," Firmenschrift Pepperl + Fuchs, 2012, http://files.pepperl-fuchs.com/selector_files/nav/productInfo/edb/216712_eng.pdf.
Second office Action issued in Chinese Patent Appln. No. 201480041593.4 dated Mar. 28, 2019.

* cited by examiner

MEASURING DEVICE HAVING A SWITCHABLE MEASURING AND OPERATING ELECTRONICS FOR DELIVERING A MEASUREMENT SIGNAL

TECHNICAL FIELD

The invention relates to a measuring device having configurable measuring and operating electronics for delivering a measurement signal.

BACKGROUND DISCUSSION

The present invention relates especially to a measuring device having a digital measurement transmitter, especially a measurement transmitter with an electrical current signal, in the case of which thus the measured value is output through control of a signal current, respectively a supply current. Digital measurement transmitters are those, which comprise at least one microprocessor for conditioning the measurement signals, respectively for controlling internal functions. A standard widely used in industry for delivering measurement signals of a physical and/or chemical, measured variable is an electrical current loop, e.g. a two conductor, electrical current loop. The measuring device is connected with a process controller via the electrical current loop. In such case, the measured value is represented by the value of the set electrical current and the electrical current is registered by the process controller. The electrical current transferred via the electrical current loop lies according to this widely used industrial standard between 0 mA and 20 mA.

Especially in safety-relevant applications, it is required to be able to detect the failure of a measurement transmitter, respectively its components, with sufficiently high probability. In the NAMUR recommendation NE43, it is provided, for example, that in the case of measuring devices a measurement signal current in a range between 4 and 20 mA is used. A device failure is signaled with a failure signal current outside this range, e.g. no greater than 3.6 mA, respectively at least 21 mA. In such case, an electrical current between 4 milliampère (mA) and 20 mA set in the electrical current loop corresponds to the measured physical and/or chemical, measured variable. Due to drift and inaccuracies, a somewhat larger electrical current range is permitted, for example, an electrical current between 3.8 mA and 20.5 mA. Electrical currents smaller than 3.6 mA, respectively greater than 21 mA, should not be interpreted by evaluating units as corresponding to a measured value. An electrical current set in the electrical current loop smaller than 3.6 mA or greater than 21 mA is, consequently, identified as an error current.

The analog measurement signal current set in the 2L electrical current loop is typically set by a control circuit in the 2L electrical current loop. In such case, at least one part of the measuring and operating electronics is part of the control circuit. For purposes of the control, a feedback variable corresponding to the actual value of the measurement signal current is read back by the measuring and operating electronics and compared with a reference input corresponding to the desired value. Usually, the reference variable is output by a control unit. The control unit outputs the reference variable corresponding to measurement signals of a measuring transducer or sensor. In the case of a measured value change, the actual value set in the 2L electrical current loop differs from the desired value. Produced from the control error signal between the actual value and the desired value is the corresponding manipulated variable, by means of which the measurement signal current in the 2L electrical current loop is changed.

A similar interface for the transmission of measurement signals and status information in digital form is standardized in EN 60947-5-6 (corresponding to IEC 60947-5-6). The operating parameters, thus the values of the electrical current associated with the digital states ON and OFF in NAMUR operation, differ from the above described. For the transmission of FPS NAMUR signals (Frequency/Pulse/Status) meeting EN 60947-5-6, the electrical current value for the ON state amounts to a value in the range 2.2 mA to 8 mA and the electrical current value for the OFF state lies in the range 0.35 mA to 1.2 mA in the case of a typical supply voltage of 8.2 V.

If the actual electrical current values lie under 0.35 mA, these can be evaluated as indication of a line interruption, while an electrical current value of over 8 mA can be evaluated as indication of a short circuit.

In the case of many applications, the size of the transmitted measurement signal can have a considerable influence on the surroundings of the measuring device and/or on the environment. Especially in the case of chemical and environment endangering processes, where a measured value of temperature, fill level, pressure, flow or composition of a measured material is transmitted, a safe running of the process is decisive. Therefore, it is extremely important that the transmitted measurement signal actually correspond to the measured value. Devices and systems in safety-relevant applications must, consequently, satisfy special requirements, among others fulfill the standards for functional safety (e.g. IEC 61508, IEC 61511, etc.). A central component of standards for functional safety is the so-called safety integrity level (SIL). Depending on the danger potentially emanating from a process or a plant, a corresponding SIL capability is required of an application. The SIL gives the probability of an arising failure of a device or an application being detected. In such case, the SIL ranges between 1 and 4, wherein 1 is the lowest and 4 the highest safety rating. Known from Offenlegungsschrift EP 1 860 513 is a circuit, which is intended to assure that an electrical current set in an electrical current loop corresponds to the actual value of the measured variable to be represented. The circuit relies on redundant adjusting of the value of the loop current and monitoring of the same. While the redundantly designed, electrical, electronic and/or electronically programmable components used in the state of the art in given cases increase the functional safety of the equipment, to be viewed as disadvantageous are the likewise increased manufacturing- and fabrication costs for a redundant design of the system and its components.

In German Publication, DE 102008001832 A1, it is provided that the evaluation unit compares at least one value of the manipulated variable output by the electrical current controller with at least one reference value and that the comparison yields whether the value of the manipulated variable exceeds or subceeds the reference value. The proposed evaluation unit enables detection of the deviation of the manipulated variable from a reference value or the exceeding or subceeding of the manipulated variable over or under a predetermined reference value. If especially two different reference values are provided, then it is detectable whether the manipulated variable exceeds or subceeds one of the reference values or lies in a region between the reference values. Since errors or disturbances of the measuring and operating electronics often appear in the form of an abnormal measurement signal, for example, in the form of excessive or lessened voltages and electrical currents, the described evaluation unit enables detection of such abnormal deviations.

Known from German Publication, DE 102004019392 A1 is a measurement transmitter, which includes a microprocessor with a reset input and a clock signal output for providing a periodic clock signal; further provided is a monitoring circuit with a clock signal input and a reset output and an electrical current controller for output of a measurement signal current, which measurement signal current represents in measurement operation in a first range a measured value and outside of the first range signals a failure; wherein the clock signal input of the monitoring circuit is connected with the clock signal output of the microprocessor, the reset input of the microprocessor is connected with the reset output of the monitoring circuit, in the case of failure of the clock signal a reset signal is periodically output on the reset output of the monitoring circuit, wherein, furthermore, the measurement transmitter has a comparator circuit with a first input, which is connected via a lowpass with the reset output of the monitoring circuit, with a second input, on which a reference voltage is applied, and with an output, which is connected with an input of the electrical current controller, wherein after repeated output of the reset signal the voltage on the first input of the comparator circuit exceeds the reference voltage, so that there is applied to the output of the comparator a control signal, which causes the electrical current controller to output a failure signal current outside of the first range. As indicated above, the first range for the measurement signal current amounts, for example, to 4 to 20 mA. In this case the failure signal current should be at least 21 mA or at most 3.6 mA, while preferably the failure signal current is controlled to 22 mA.

As already mentioned above, a similar interface for the transmission of measurement signals and status information is standardized in digital form in EN 60947-5-6 (corresponding to IEC 60947-5-6). The operating parameters, thus, the values of the electrical current in NAMUR operation associated with the digital states ON and OFF, differ from those above described. A simple and usual circuit of an EN 60947-5-6 switching amplifier for the transmission of FPS NAMUR signals (Frequency/Pulse/Status) includes a switch transistor with a parallel resistor across the transistor between the terminals of the in/output and a series resistor. With the standardized operating parameters of 8.2 V and an electrical current value for the ON state from 2.2 mA to 8 mA and an electrical current value for the OFF state from 0.35 mA to 1.2 mA, there results typical values of 1 kOhm for the series resistor and 11 kOhm for the parallel resistor. If the actual electrical current values lie under 0.35 mA, these can be evaluated as indication of a line interruption, while electrical current values over 8 mA are an indication of a short circuit.

In order to be able to cover different applications of the device, a switching amplifier according to EN 60947-5-6 should be able to be used in NAMUR and in non-NAMUR operation. In this regard, different solutions are known from the state of the art. In the simplest and usual form, jumpers are provided, with which the series resistor can be shunted and the electrical current path via the parallel resistor interrupted. In NAMUR operation, the jumper across the series resistor is opened and the jumper in the electrical current path of the parallel resistor closed, while, in the case of non-NAMUR operation, the opposite holds. Thus, each device comes with just one jumper, which can be plugged in at the appropriate location according to application. Disadvantageous in the case of this solution is that, for each change of the operating manner, a service technician must visit the device and tinker with it. This can be very cumbersome in the case of widely distributed devices in large production plants or in the case of devices at exposed locations. For switching the operating manner, the device housing must opened and electronic assemblies contacted and even removed. There is the danger of damage to the device electronics as a result of electrostatic discharges or as a result of locations which are not adequately closed upon the resealing of the housing. Both can lead to malfunction or failure of the device. Furthermore, the operating electronics cannot register the operating state and therewith a self-diagnosis is impossible. Likewise, a remote-controlled switching of the operating manner is not possible.

It is, consequently, also known to replace the jumper with relays. These have, however, the disadvantage of additional space requirement, increase the power consumption of the device and therewith also the thermal load on the device electronics and are due to the movable components relatively sensitive to vibrations. It is, consequently, also known to use, instead of relays, semiconductor switches, which especially do not have the vibration sensitivity. They are, however, relatively expensive.

The application of a 4-20 mA NE43 interface, such as above described, is not possible in connection with an interface meeting EN 60947-5-6, since no sufficiently reliable differentiating of the ON/OFF states of the EN 60947-5-6 output signal is possible.

An object of the invention, therefore, is to provide an improved measuring device having a configurable measuring and operating electronics for delivering a measurement signal.

SUMMARY OF THE INVENTION

A measuring device of the invention includes a configurable measuring and operating electronics for delivering a measurement signal, wherein the measuring device includes at least one measurement transmitter with an electrical current control circuit (15) for outputting a controlled electrical current, wherein in at least a first manner of operation an electrical current can be set in a first electrical current range, and in at least a second manner of operation an electrical current can be set in a second electrical current range, which second electrical current range has a greater interval than the first electrical current range, wherein the measuring device further includes a microcontroller circuit (13), and the microcontroller circuit (13) is connected with the electrical current control circuit (15), wherein the microcontroller circuit (13) is connected with the electrical current control circuit (15) via a line (36) for delivering a digital signal for operating the electrical current control circuit (15), wherein the digital signal has a LOW state and a HIGH state and wherein by operating the electrical current control circuit by the digital signal an output current can be set with an electrical current level in a first electrical current level interval for the LOW state and with an electrical current level in a second electrical current level interval for the HIGH state of the digital signal in the first manner of operation.

By intelligent control of various operating modes and electrical current level intervals, a complicated resistor circuit—such as was so far usual for NAMUR conforming measuring devices—can be omitted.

It is advantageous when the output current can be set by the digital signal in the first manner of operation in such a manner that the first electrical current level interval has a lower limit value for the first electrical current level interval and an upper limit value for the first electrical current level interval; and that the second electrical current level interval has a lower limit value for the second electrical current level interval and an upper limit value for the second electrical current level interval, wherein the upper limit value of the first electrical current level interval is fixed in such a manner that it has a smaller magnitude than the lower limit value of the second electrical current level interval.

The first electrical current range can be advantageously set to an electrical current between 0.35 mA and at least 8 mA.

The second electrical current range can be advantageously set to an electrical current between 0 mA and at least 20 mA.

Especially preferably, a measuring device includes a configurable measuring and operating electronics for delivering a measurement signal, wherein the measuring device includes at least one measurement transmitter with an electrical current control circuit for outputting a controlled electrical current, wherein in at least a first manner of operation an electrical current can be set between 0.35 mA and at least 8 mA, and in an at least a second manner of operation an electrical current can be set between 0 mA and at least 20 mA, wherein the measuring device further includes a microcontroller circuit and the microcontroller circuit is connected with the electrical current control circuit, wherein the microcontroller circuit is connected with the electrical current control circuit via a line for outputting a digital signal for operating the electrical current control circuit for setting an output current from 0.35 mA to 1.2 mA for the LOW state and 2.2 mA to 8 mA for the HIGH state of the digital signal in the first manner of operation. By the development of the invention, the measuring device can be universally applied and NAMUR operation according to EN 60947-5-6 and non-NAMUR operation as well as operation as a 0 to 20 mA electrical current loop can be performed without changing the operating electronics. A changing of the operating modes can, in such case, be performed with remote control by software. The invention expands the field of use of such measuring devices, since then one universal device is sufficient for all established operating modes and no special types need to be produced and held in inventory. Furthermore, a user of such devices can also change the manner of operation of its process control, without all measuring devices in the plant needing to be retrofit or replaced.

Helpfully, the electrical current control circuit further includes an electrical current measuring system, which is connected with the microcontroller circuit for feedback of the actual value of the set electrical current. In this way, a self-diagnosis of the connection by the measuring device is enabled.

An extensive diagnostic opportunity by a process control connected with the measuring device results when the electrical current control circuit is connected in the first manner of operation to an external voltage source as passive load.

Especially advantageous for the remote-controlled changing of the manner of operation is when the connection between microcontroller and electrical current control circuit includes special lines for delivering control signals for setting the manner of operation. Particularly suitable is when the connection between microcontroller and electrical current control circuit includes four special lines for delivering control signals for setting the manner of operation.

The object of the invention can additionally be achieved by a method for operating a configurable measuring and operating electronics for delivering a measurement signal, wherein the measuring device includes at least one measurement transmitter with an electrical current control circuit (15) for outputting a controlled electrical current, wherein in at least a first manner of operation an electrical current can be set in a first electrical current range, and in at least a second manner of operation an electrical current can be set in a second electrical current range, which second electrical current range has a greater interval than the first electrical current range, and wherein the measuring device further includes a microcontroller circuit (13) and the microcontroller circuit (13) is connected with the electrical current control circuit (15), and wherein for operating the electrical current control circuit (15) a digital signal is transmitted from the microcontroller circuit, wherein the digital signal has a LOW state and a HIGH state and wherein by operating the electrical current control circuit by the digital signal a setting of the output current by the electrical current control circuit (15) occurs, with an electrical current level in a first electrical current level interval for the LOW state and with an electrical current level in a second electrical current level interval for the HIGH state of the digital signal in the first manner of operation.

Advantageous variants of the invention are subject matter of the dependent claims.

It is advantageous when the output current can be set by the digital signal in the first manner of operation in such a manner that the first electrical current level interval has a lower limit value for the first electrical current level interval and an upper limit value for the first electrical current level interval; and that the second electrical current level interval has a lower limit value for the second electrical current level interval and an upper limit value for the second electrical current level interval, wherein the upper limit value of the first electrical current level interval is fixed in such a manner that it has a smaller magnitude than the lower limit value of the second electrical current level interval.

It is additionally advantageous when the first electrical current range can be set to an electrical current between 0.35 mA and at least 8 mA.

It is additionally advantageous when the second electrical current range can be set to an electrical current between 0 mA and at least 20 mA.

An especially preferred embodiment is a method for operating a configurable measuring and operating electronics for delivering a measurement signal, wherein the measuring device includes at least one measurement transmitter with an electrical current control circuit for outputting a controlled electrical current, wherein in a first manner of operation an electrical current can be set between 0.35 mA and at least 8 mA, and in a second manner of operation an electrical current can be set between 0 mA and at least 20 mA, wherein the measuring device further includes a microcontroller circuit and the microcontroller circuit is connected with the electrical current control circuit, in the case of which the electrical current control circuit is operated in the first manner of operation with a digital signal for setting an electrical current from 0.35 mA to 1.2 mA for the LOW state and 2.2 mA to 8 mA for the HIGH state, especially when the electrical current control circuit acts as passive load relative to an external voltage source.

Self-diagnosis by the measuring device is enabled when the actual value of the electrical current set in the electrical current control circuit is monitored and an alarm signal output, when the electrical current subceeds a value of 0.35 mA, especially amounts to a value of 0.2 mA or less.

Advantageously, the set electrical current is independent of the supply voltage in the case of an external supply voltage at least in the range from 1.25 V, preferably from 0.4 V, to 36 V, preferably to 24 V, especially preferably to 8.5 V.

For the remote-controlled changing of the manner of operation, it is especially advantageous when the setting of the manner of operation occurs by means of control signals, preferably four control signals, by way of acting on components the electrical current control circuit.

BRIEF DESCRIPTION OF THE DRAWINGS

For a more detailed explanation of the invention, an example of an embodiment of the invention will now be described based on the appended drawing, the figures of which show as follows.

DETAILED DESCRIPTION

Figure 1:
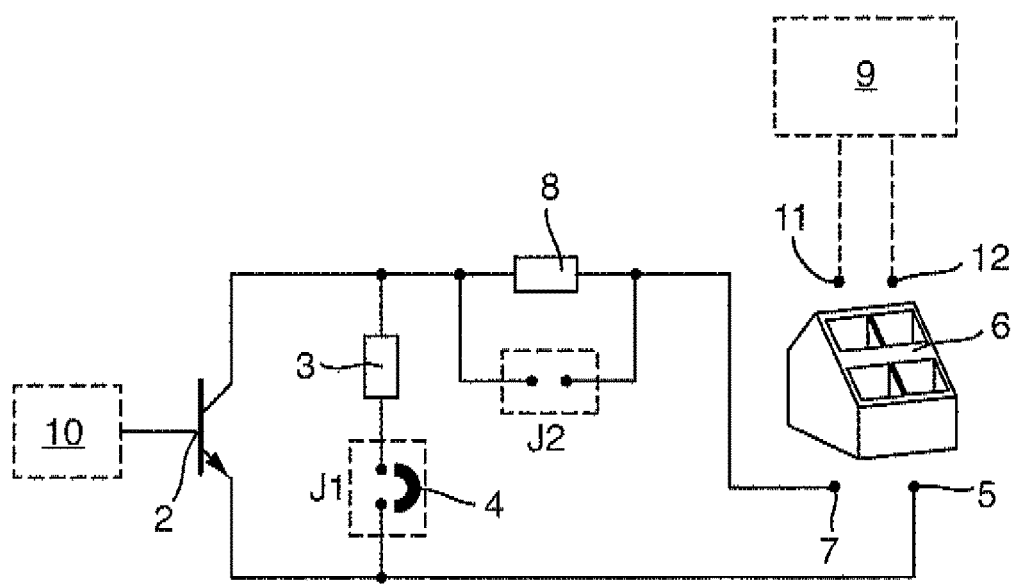
FIG. 1 is a switching amplifier according to the state of the art in a circuit for NAMUR operation meeting EN 60947-5-6-.
Figure 2:
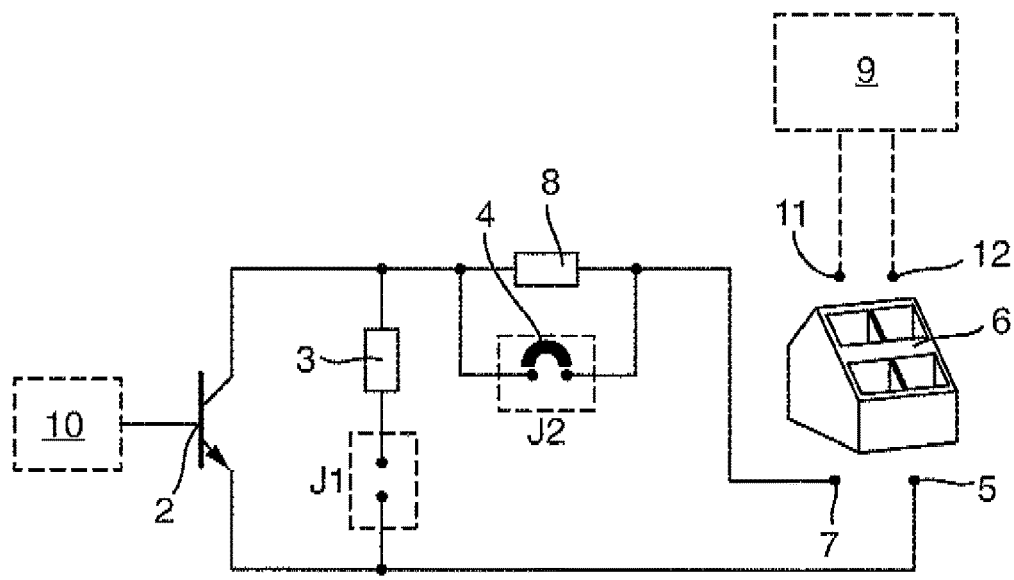
FIG. 2 is a switching amplifier according to the state of the art in a circuit for non-NAMUR operation, e.g. according to EN 1434-2 class OB.

FIGS. 1 and 2 show a known switching amplifier referred to here, as a whole, with the numeral 1 in a circuit (FIG. 1) conforming to EN 60947-5-6, respectively in a circuit (FIG. 2) for a "non-NAMUR" operation, e.g. according to EN 1434-2 class OB. The switching amplifier 1 is part of an electrical current control circuit of a measurement transmitter of a measuring device. The switching amplifier 1 includes a switching transistor 2 and a first resistor 3, here referred to as the parallel resistor 3 for short, connected parallel to the switching transistor 2. Provided in the electrical current path of the parallel resistor 3 is a first plugin location J1 for a jumper 4. If the jumper 4 is introduced, such as shown in FIG. 1, the parallel resistor is, such as earlier described, connected parallel to the collector-emitter path of the switching transistor 2. If the jumper 4 is removed, then the electrical current path through the parallel resistor 3 is interrupted.

In the case of the illustrated circuit, the emitter of the switching transistor 2 is connected with a connection 5 of a terminal block 6. The other connection 7 of the terminal block 6 is connected via a series connected resistor 8, here referred to as series resistor 8, with the parallel circuit of parallel resistor 3 and with the collector of the switching transistor 2. Additionally, a further plugin location J2 for a jumper 4 is connected parallel to the series resistor 8, so that an electrical current in the case of not plugged in jumper 4, such as shown in FIG. 1, flows through the series resistor 8.

If a jumper 4 is introduced into the plugin location J2, the series resistor 8 is shunted and the electrical current flows via the jumper 4, such as shown in FIG. 2.

Connected to the terminal block 6 are the two conductors of the 2L electrical current loop, which connect the measuring device with a process control 9, so that the one conductor is connected with the line at the connection 5 and the other conductor with the connection 7 at the terminal block 6. The process control 9 is only schematically indicated. The switching transistor 2 is operated via an input stage 10 of the switching amplifier 1 likewise only schematically indicated in FIGS. 1 and 2.

In the case of the first manner of operation of the switching amplifier illustrated in FIG. 1, via the jumper 4 plugged into the plugin location J1, the parallel resistor 3 is connected parallel to the switching transistor 2. The other plugin location J2 is empty, so that the series resistor 8 is located in the electrical current path between the connection 7 and the switching transistor 2. This manner of operation corresponds to NAMUR operation according to EN 60947-5-6. If the switching transistor 2 is caused to conduct, the electrical current flows from the connection 7 of the terminal block 6 via the series resistor 8 and the switching transistor 2 to the connection 5 of the terminal block 6.

The parasitic electrical current flow via the parallel resistor 3 caused by the voltage drop across the conducting switching transistor 2 can be neglected, in such case. The end result is that the series resistor 8 limits the short circuit current.

If the switching transistor 2 becomes non-conducting, the electrical current flow from the connection 7 of the terminal block 6 occurs via the series resistor 8 and the parallel resistor 3 to the connection 5 of the terminal block 6. This means that the electrical current through the series circuit is determined by series resistor 8 and parallel resistor 3.

With the standardized operating parameters of 8.2 V and an electrical current value for the HIGH state from 2.2 mA to 8 mA and an electrical current value for the LOW state from 0.35 mA to 1.2 mA, typical values of 1 kOhm for the series resistor 8 and 11 kOhm for the parallel resistor 3 result.

In the case of this manner of operation, measuring the electrical current in the process control can serve for monitoring of the line 11 for the measuring device. If the actual electrical current values lie below 0.35 mA, this can be interpreted as indicating a line interruption, while, in the case of an electrical current value of above 8 mA, such can be interpreted as indicating a short circuit. Upon detecting such incorrect electrical current values, the process control can trigger a corresponding alarm and, in given cases, lead to switching from a controlled operation of a plant to a handled operation.

In a second manner of operation, such as is shown in FIG. 2, the measured value is represented by the value of the set electrical current and the electrical current is registered by the process control 9. The electrical current transferred via the electrical current loop lies between 0 mA and 20 mA according to the well-known industrial standard.

For this, the jumper 4 is removed from the plugin location J1 and introduced into the plugin location J2. The electrical current flow occurs from the connection 5 of the terminal block 6 via the switching transistor 2 and with shunting of the series resistor 8 by the jumper 4 in the plugin location J2 to the connection 7 of the terminal block 6. As in the case of the first manner of operation, the measuring device can be connected with the the process control 9 by the terminal block 6 via a 2L-line via connections 11 and 12.

In the case of this manner of operation, a function monitoring of the line 11 according to NAMUR recommendations is not possible. Disadvantageous in the case of this solution is that for each changing of the operating manner a service technician must visit the device, open it and tinker in the device, namely in order to move the jumper 4 into the respectively appropriate plugin location J1 or J2. This can be very cumbersome in the case of widely distributed devices in large production plants or in the case of devices in exposed locations. Moreover, for switching the manner of operation, the measuring device housing must be opened and electronic assemblies contacted or even removed. As a result, there is the danger of damage to the device electronics by electrostatic discharges or as a result of unsealed locations accidentally left in the case of resealing the housing. Both can lead to malfunctions or failure of the device.

Figure 3:
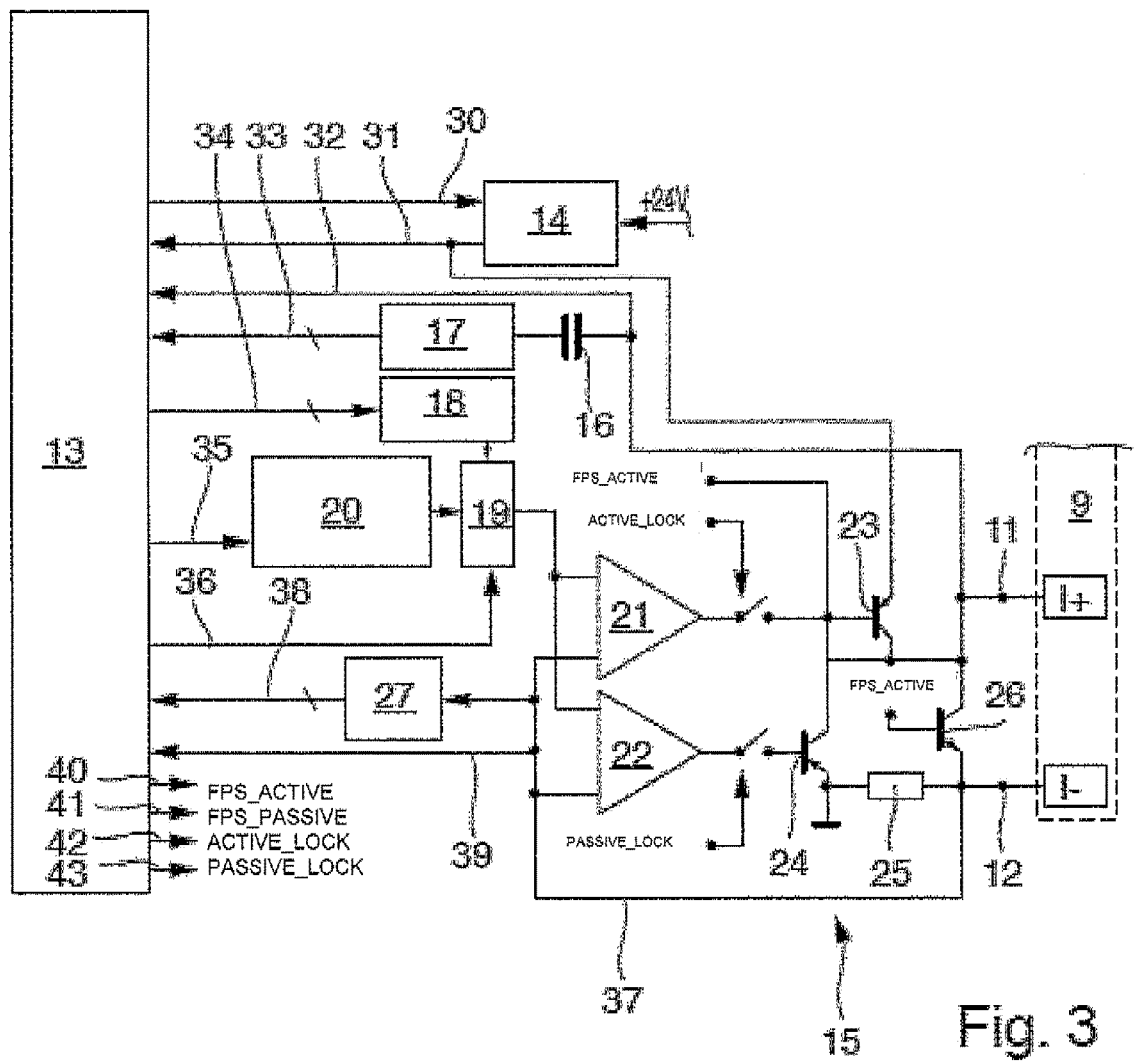
FIG. 3 is a measuring and operating electronics configurable according to the invention, in the form of a circuit switchable between, among others, operation (NAMUR) meeting EN 60947-5-6 and 0 to 20 mA operation (non-NAMUR).

In the case of the embodiment of the invention illustrated in FIG. 3 of a configurable measuring and operating electronics for a measuring device for delivering a measurement signal of the measuring device, such an intervention for switching the circuit to another manner of operation is not required. Rather, the switching of the manner of operation can occur e.g. per software, even under remote control. In this way, not only the time- and labor costs for the service technician for switching the manner of operation can be saved, but, instead, also the reliability the measuring devices is increased, since the electronics is not endangered through electrostatic discharges and a continuously sealed state of the measuring device housing is supported by removing reasons for opening the housing. Finally, measuring devices with the electronics of the invention can be constructed compactly, since in the case of the arrangement of the circuit boards and components no longer must consideration be given to accessibility of jumpers 4 and their plug-in locations J1 and J2. Moreover, the resistors 3 and 8 as well as the plug-in locations J1 and J2 can be omitted.

Especially advantageous in the case of the solution of the invention is that a switching of the manner of operation of the electronics can occur at practically any time, and done as frequently as desired, so that data can be transmitted via different transmission protocols almost simultaneously.

The measurement transmitter of the invention includes a microcontroller circuit, here in the form of an integrated microcontroller 13. The circuitry of the microcontroller 13 is limited and shown simplified as a block diagram for purpose of explaining the invention. Other circuitry, e.g. for communication via a fieldbus, can be provided in usual manner. The shown measurement transmitter includes a so-called step-down converter 14 for providing a direct voltage, which is won from the internal supply voltage of typically 24 V direct voltage. The output voltage of the step-down converter 14 can be controlled by the microcontroller 13 via line 30 and the output of the step-down converter 14 monitored by the microcontroller 13 via line 31. The output of the step-down converter 14 is, furthermore, connected with the electrical current control circuit referred to as a whole with the numeral 15. The setting of the output voltage of the step-down converter 14 is selected to match the operating parameters of the current operating state and can also be decreased for limiting power loss in the electrical current control circuit 15.

The measuring and operating electronics of the measuring device, especially the measurement transmitter, is connected via the connections 11 and 12 to an electrical current loop. The external part of the electrical current loop is formed by the process control 9. The measurement signal current representing a measured value and/or other data in analog or digital form can be set in the electrical current loop.

The output voltage on the connection 11 is monitored via line 32. Various types of general status- and diagnostic information can be derived from the voltage signal.

Often it is required to transmit, besides the analog electrical signal or the digital FPS signal, other information, for example, calibration data, parameter data, operating temperature and voltage, etc. via the 2L electrical current loop.

In order to transmit this information, a high frequency signal is superimposed on the measurement signal. A protocol for delivering such information is, for example, the HART (Highway Addressable Remote Transducer) protocol. Via a decoupling capacitor 16 and a bandpass filter 17, the HART input signal, which is provided from the process control via the 2L line, is tapped from the connection 11, out-coupled and fed via the line 33 to the microcontroller 13 for decoding and evaluation.

A HART output signal is output via the line 34 from the microcontroller 13 and transferred to a mixer 19 as a digital-analog converted signal conditioned in a pseudo sine generator 18. A further input signal is fed to the mixer 19 from the digital-analog converter (DAC) 20. DAC 20, shown here as a separate circuit element, outputs a signal representing the measured value. The signal from the microcontroller 13 is output e.g. as a pulse width modulated signal via the cable 35. An FPS NAMUR signal (Frequency/Pulse/Status) can, if required, be fed directly to the mixer 19 via line 36.

Mixer 19 presents on its output a signal corresponding to the desired value of the electrical current to be set in the electrical current loop. The output of the mixer 19 is connected with the inputs of two operational amplifiers (OPAMP) 21, 22, which form the input stage 10 of the electrical current control circuit 15. The first OPAMP 21 controls a first transistor 23 of the electrical current control circuit 15. The emitter of the first transistor 23 is connected with the output of the step-down converter 14, while the collector is connected with the plus-connection 11 of the electrical current loop. The second OPAMP 22 controls a second transistor 24, whose collector is connected with the plus-connection 11 of the electrical current loop and whose emitter is connected with ground. Between ground and the minus-connection 12 of the electrical current loop, a resistor 25 is arranged, which serves as electrical current measuring resistor and has a correspondingly low value.

Arranged between plus-connection 11 and minus-connection 12 of the electrical current loop is a third transistor 26, wherein the collector is connected with the plus-connection 11 and the emitter with the minus-connection 12. Transistor is purpose-supportingly embodied with a (not shown) emitter resistor of small resistance value of e.g. 1 ohm, in order to be able to measure the electrical current flowing through the transistor 26.

The minus-connection 12 of the electrical current loop is fed back via a line 37 to the inverting inputs of the OPAMPs 21, 22. Furthermore, the minus-connection 12 of the electrical current loop is connected with an analog-digital converter (ADC) 27, whose digital output signal is conveyed via the cable 38 to an input port of the microcontroller 13. The voltage signal from the minus-connection 12 of the electrical current loop can also be conveyed via the line 39 directly to a port connector of the microcontroller 13 for a direct Yes/No registration. As a function of the electrical current through the resistor 25, there sets on the minus-connection 12 of the electrical current loop a voltage difference opposite ground, wherein here this voltage difference is evaluated.

The operation of an electrical current control with operational amplifiers is known to those skilled in the art and, consequently, not explained in further detail here.

Besides the above described outputs, the microcontroller 13 has another four output lines 40 to 43, which are labeled in the appended drawing with FPS_ACTIVE, FPS_PASSIVE, ACTIVE_LOCK and PASSIVE_LOCK. Line 40

(FPS_ACTIVE) leads to the base of the first transistor 23, while line 41 (FPS_PASSIVE) leads to the base of the third transistor 26.

Lines 42 and 43 (corresponding to ACTIVE_LOCK and PASSIVE_LOCK) lead to control inputs on the OPAMPs 21, respectively 22. If the level on the output 42 (ACTIVE_LOCK) lies at LOW (0 V) or if the output 42 is high resistance, the OPAMP 21 cannot operate the first transistor 23. If the level lies at HIGH (+3 V), the OPAMP 21 can operate the transistor 23. In similar manner, the OPAMP 22 cannot operate the second transistor 24, when the level on the output 43 (PASSIVE_LOCK) lies at HIGH (+3 V) or is high resistance. If the level, however, lies at LOW (0 V), the OPAMP 22 can operate the transistor 24. Therefore, these inputs of the OPAMPs 22, 23 are symbolized as switches in the drawing.

In a first manner of operation corresponding to NAMUR operation according to EN 60947-5-6, a digital FPS NAMUR signal (Frequency/Pulse/Status) is fed from the microcontroller circuit 13 via the line 36 directly to the mixer 19. Line 40 (FPS_ACTIVE) to the base of the first transistor 23 and line 41 (FPS_PASSIVE) to the base of the third transistor 26 lie at 0 V. Therefore, the transistors 23 and 26 are non-conducting. The electrical current loop is fed from the process control 9 as external voltage source and leads from the connection 11 via the transistor 24 and the electrical current measuring resistor 25, as well as the connection 12, back to the process control 9. Correspondingly, the signal on line 42 (ACTIVE_LOCK) lies at LOW (0 V) and the OPAMP 21 cannot operate the first transistor 23. Line 43 (PASSIVE_LOCK) lies likewise at LOW (0 V) and the OPAMP 22 can operate the transistor 24. The electrical current control circuit 15 acts, consequently, on the process control 9 as an external voltage source in the form of a passive load. The OPAMP 22 obtains its input signal from the mixer 19, so that the electrical current control circuit 15 sets the output current to a value of 0.35 mA to 1.2 mA for the LOW state of the FPS NAMUR signal and 2.2 mA to 8 mA for the HIGH state of the digital FPS NAMUR signal.

Falling across the electrical current measuring resistor 25, in such case, is a voltage corresponding to the electrical current according to the formula U=R×I with U=voltage in volt, R=resistance value of the electrical current measuring resistor 25 in ohm and I=value of the electrical current in Ampère actually flowing through the electrical current measuring resistor 25. This voltage on the emitter output of the transistor 24, negative relative to the reference ground, is fed back via line 37 to the inverting input of the OPAMP 22 for control of the electrical current and to the input of the analog-digital converter (ADC) 27. The digitized signal is fed via line 38 to the microcontroller 13. In this way, the actual value of the electrical current in the electrical current loop can be evaluated by the software in the microcontroller 13. If the obtained signal corresponds to a value of the actually flowing electrical current of less than 0.35 mA, especially less than 0.2 mA, this is indication of an interruption of the electrical current loop, e.g. by a line break of the connection to the process control 9. Since in such a case the connection from the process control 9 as external voltage source for the electrical current loop is missing, the electrical current can assume no mentionable value independently of the action of the OPAMP 22 on the transistor 24. Somewhat the same holds also for a short circuit in the line to the process control 9, since in such a case the voltage is decreased via the short circuit. Thus, a failure state (line interruption or short circuit) can be recognized not only by the process control 9, but, instead, also by the operating electronics of the measuring device. Even when this self-diagnosis capability of the operating electronics does not enable a distinguishing between line interruption and short circuit, an alarm signal can be directly output from the measuring device. Thus, e.g. persons located in the vicinity of the measuring device can directly perform the needed measures, e.g. undertake a manual control of a process.

In an additional manner of operation, electrical current output passive, the electrical current path of the electrical current loop corresponds to that above described. For this, a signal representing the measured value is output via the cable 35 from the microcontroller 13 e.g. as pulse width modulated signal to the DAC 20. The DAC 20, here shown as a separate circuit element, outputs an analog signal representing the measured value to the mixer 19. The output signal of the mixer 19 is, such as above described, output to the OPAMP 22 and the electrical current in the electrical current loop is correspondingly controlled. Via evaluation of the actual electrical current flow, a correction of the PWM signal and therewith an external control of the electrical current can occur, in case required.

In an additional manner of operation, status input with load current, the electrical current path of the electrical current loop corresponds to that as above described. In such case, via the PWM output 35, a predetermined fixed load current is predetermined in the electrical current loop and set in the electrical current loop via the OPAMP 22. Via the line 32, voltage changes at the connection 11 are registered and transferred to the microcontroller 13 and evaluated. In the case of this manner of operation, an option is to simulate the behavior of earlier usual status inputs, especially such with non-linear characteristic curves, for use in existing process control installations.

In an additional manner of operation, electrical current input passive, the electrical current path of the electrical current loop corresponds to that as above described. For this, via the cable 35, a signal representing a maximum current, e.g. 25 mA, is output from the microcontroller, e.g. as a pulse width modulated signal, to the DAC 20. The DAC 20, here shown as a separate circuit element, outputs a corresponding analog signal to the mixer 19. The output signal of the mixer 19 is output as above described to the OPAMP 22. Since the actual electrical current lies, normally, below the maximum electrical current, the OPAMP 22 works in saturation. If the electrical current in the electrical current loop rises above the maximum value, the transistor 24 begins to block and prevents therewith an additional electrical current rise. The threshold value for the maximum current can be changed by changing the duty cycle of the PWM signal. The electrical current in the electrical current loop is measured as above described and correspondingly evaluated.

In an additional manner of operation, status input high resistance, the signal on the line 43 (PASSIVE_LOCK) is set to HIGH (+3 V) and the OPAMP 22 cannot operate the transistor 24. The electrical current control circuit 15 is therewith deactivated. The voltage on the connection 11 is measured as in the case of the manner of operation "status input with load current" and evaluated.

In an additional manner of operation, electrical current input active, the electrical current control circuit is configured similarly to that in the manner of operation "electrical current input passive". However, in this case, the signal on the line 43 (PASSIVE_LOCK) is set to HIGH (+3 V) and the OPAMP 22 cannot operate the transistor 24. However, the level on the output 42 (ACTIVE_LOCK) lies likewise at HIGH (+3 V) and the OPAMP 21 can operate the transistor 23. Serving as voltage source, in such case, is the internal step-down converter 14, which is operated via the line 30 by the microcontroller 13. Via the cable 35, a signal representing a maximum current, e.g. 25 mA, is output from the microcontroller, e.g. as a pulse width modulated signal, to the DAC 20. The DAC 20, here shown as a separate circuit element, outputs a corresponding analog signal to the mixer 19. The output signal of the mixer 19 is, such as above described, output to the OPAMP 21. Since the actual electrical current lies, normally, below the maximum electrical current, the OPAMP 21 works in saturation. If the electrical current in the electrical current loop rises above the maximum value, the transistor 23 begins to block and prevents therewith an additional electrical current rise. The threshold value for the maximum current can be changed by changing the duty cycle of the PWM signal. The electrical current in the electrical current loop is measured as above described and correspondingly evaluated, wherein the voltage falling across the electrical current measuring resistor 25 assumes, in this case, a positive value.

In an additional manner of operation, electrical current output active, the internal step-down converter 14 serves as voltage source, which is operated by the microcontroller via the line 30. In this case, the signal on the line 43 (PASSIVE_LOCK) is set to HIGH (+3 V) and the OPAMP 22 cannot operate the transistor 24. The level on the output 42 (ACTIVE_LOCK) lies likewise at HIGH (+3 V) and the OPAMP 21 can operate the transistor 23. Via the cable 35, a signal representing the measured value is output from the microcontroller e.g. as a pulse width modulated signal, to the DAC 20. The DAC 20, here shown as a separate circuit element, outputs to the mixer 19 an analog signal representing the measured value. The output signal of the mixer 19 is output to the OPAMP 21 and the electrical current in the electrical current loop is correspondingly controlled. The electrical current in the electrical current loop is measured as described above and correspondingly evaluated, wherein the voltage falling across the electrical current measuring resistor 25 assumes, in this case, a positive value. In such case, the feedback of the voltage value of the electrical current measuring resistor 25 goes to the inverting input of the OPAMP 21. Via the evaluation of the actual electrical current flow, a correction of the PWM signal and therewith an external control of the electrical current can occur, in case required. Also here, a self-diagnosis is possible. If namely the predetermined electrical current value cannot be controlled, but, instead, the voltage on the connection 12 is approximately zero, a line interruption is present in the electrical current loop.

In an additional manner of operation, FPS active, the signal on line 43 (PASSIVE_LOCK) is set to HIGH (+3 V) and the signal on line 42 (ACTIVE_LOCK) is set to LOW (0 V), so that neither the transistor 23, nor the transistor 24 can be operated by the OPAMPs 21 and 22. The transistor 23 is operated via the clocked signal on line 40 (FPS_ACTIVE) directly in switching operation, while, via the inverted FPS signal on line 41 (FPS_PASSIVE), the transistor 26 is operated in push pull operation. The electrical current through the electrical current loop can be measured as above described and evaluated.

In an additional manner of operation, FPS passive, likewise the signal on line 43 (PASSIVE_LOCK) is set to HIGH (+3 V) and the signal on line 42 (ACTIVE_LOCK) is set to LOW (0 V), so that neither the transistor 23 nor the transistor 24 can be operated by the OPAMPs 21 and 22. The signal on line 40 (FPS_ACTIVE) lies at LOW (0 V). Transistor 26 is operated by the FPS signal directly in switching operation.

The voltage source in the electrical current loop is formed by the process control 9. If the voltage on the connection 11, which can be registered via line 32, exceeds the voltage on the connection 12, which can be registered via line 37 and the ADC 27, by a value of, for instance, 0.8 V, the transistor 26 has changed from switching operation to linear operation. Upon detecting this state, an alarm signal can be output by the microcontroller 13 and the output current turned off, in order to prevent destruction of the transistor 26 by thermal overloading.

Besides the embodiment of a measuring device having a configurable measuring and operating electronics for delivering a measurement signal, especially with a measurement transmitter, as above described and shown in the figures, in the context of the invention numerous other embodiments can be provided, in the case of which an electrical current control circuit has both a control range from 0 mA to 20 mA, as well as also permitting operation as a switching amplifier in non-NAMUR operation (e.g. passive pulses according to EN1434, class OB) and in NAMUR operation according to EN 60947-5-6.

The invention claimed is:

1. A measuring device comprising: a software-configurable measuring and operating electronics for delivering a measurement signal, wherein the measuring device comprises one measurement transmitter with an electrical current control circuit for outputting a controlled electrical current, wherein in at least a first manner of operation an electrical current can be set in a first electrical current range, and in at least a second manner of operation an electrical current can be set in a second electrical current range, which second electrical current range has a greater interval than the first electrical current range; and a microcontroller circuit, and the microcontroller circuit is connected with the electrical current control circuit, wherein the microcontroller circuit is connected with the electrical current control circuit via a line for delivering a digital signal for operating the electrical current control circuit, wherein the digital signal has a LOW state and a HIGH state and wherein by operating the electrical current control circuit by the digital signal an output current can be set with an electrical current level in a first electrical current level interval for the LOW state and with an electrical current level in a second electrical current level interval for the HIGH state of the digital signal in the first manner of operation, wherein:

the second electrical current range is set to an electrical current between 0 mA and at least 20 mA;

the transmission of the digital signal for operating the electrical current control circuit enables the setting of the output current from 0.35 mA to 1.2 mA for the first electrical current level interval in the LOW state of the digital signal in the first manner of operation and from 2.2 mA to 8 mA for the second electrical current level interval in the HIGH state of the digital signal in the first manner of operation; and the measuring device is software-configurable to perform NAMUR operation according to EN60947-5-6.

2. The measuring device as claimed in claim 1, wherein: the output current can be set by the digital signal in the first manner of operation in such a manner that the first electrical current level interval has a lower limit value for the first electrical current level interval and an upper limit value for the first electrical current level interval; and that the second electrical current level interval has a lower limit value for the second electrical current level interval and an upper limit value for the second electrical current level interval, wherein the upper limit value of the first electrical current level interval is fixed in such a manner that it has a smaller magnitude than the lower limit value of the second electrical current level interval.

3. The measuring device as claimed in claim 1, wherein: the first electrical current range can be set to an electrical current between 0.35 mA and at least 8 mA.

4. The measuring device as claimed in claim 1, wherein: the electrical current control circuit further comprises an electrical current measuring system, which is connected with the microcontroller circuit for feedback of the actual value of the set electrical current.

5. The measuring device as claimed in claim 1, wherein: the electrical current control circuit in the first manner of operation is connected to an external voltage source as passive load.

6. The measuring device as claimed in claim 1, wherein: the connection between microcontroller and electrical current control circuit includes special lines for delivering control signals for setting the manner of operation.

7. The measuring device as claimed in claim 6, wherein: the connection between microcontroller and electrical current control circuit includes four special lines for delivering control signals for setting the manner of operation.

8. A method for operating a configurable measuring and operating electronics for delivering a measurement signal, as claimed in claim 1, wherein the measuring device includes one measurement transmitter with an electrical current control circuit for outputting a controlled electrical current, and the measuring device further including a microcontroller circuit and the microcontroller circuit is connected with the electrical current control circuit,
the method comprising:
in at least a first manner of operation, setting an electrical current in a first electrical current range, and
in at least a second manner of operation, setting an electrical current in a second electrical current range, which second electrical current range has a greater interval than the first electrical current range, and
transmitting a digital signal from the microcontroller circuit for operating the electrical current control circuit, wherein the digital signal has a LOW state and a HIGH state and wherein by operating the electrical current control circuit by the digital signal a setting of the output current by the electrical current control circuit occurs, with an electrical current level in a first electrical current level interval for the LOW state and with an electrical current level in a second electrical current level interval for the HIGH state of the digital signal in the first manner of operation, wherein the second electrical current range can be set to an electrical current between 0 mA and at least 20 mA; and
the transmission of the digital signal for operating the electrical current control circuit enables setting the output current from 0.35 mA to 1.2 mA for the first electrical current level interval in the LOW state of the digital signal in the first manner of operation and from 2.2 mA to 8 mA for the second electrical current level interval in the HIGH state of the digital signal in the first manner of operation;
wherein the measuring device is software-configurable to perform NAMUR operation according to EN60947-5-6.

9. The method as claimed in claim 8, wherein:
the output current can be set by the digital signal in the first manner of operation in such a manner that the first electrical current level interval has a lower limit value for the first electrical current level interval and an upper limit value for the first electrical current level interval; and
that the second electrical current level interval has a lower limit value for the second electrical current level interval and an upper limit value for the second electrical current level interval, wherein the upper limit value of the first electrical current level interval is fixed in such a manner that it has a smaller magnitude than the lower limit value of the second electrical current level interval.

10. The method as claimed in claim 8, wherein:
the first electrical current range can be set to an electrical current between 0.35 mA and at least 8 mA.

11. The method as claimed in claim 8, wherein:
the electrical current control circuit acts relative to an external voltage source as passive load.

12. The method as claimed in claim 8, wherein:
the actual value of the electrical current set in the electrical current control circuit is monitored and an alarm signal output, when the electrical current subceeds a value of 0.35 mA, especially amounts to a value of 0.2 mA or less.

13. The method as claimed in claim 8, wherein:
the set electrical current in the case of an external supply voltage is at least in the range from 0.4 V to 36 V, independently of the supply voltage.

14. The method as claimed in claim 8, wherein:
the setting of the manner of operation occurs by means of control signals, preferably by four control signals, by direct action on components of the electrical current control circuit.

15. The method as claimed in claim 13, wherein:
the set electrical current in the case of an external supply voltage is at least in the range from 0.4 V to 24 V independently of the supply voltage.

16. The method as claimed in claim 13, wherein:
the set electrical current in the case of an external supply voltage is at least in the range from 0.4 V to 8.5 V, independently of the supply voltage.

* * * * *